(12) United States Patent
Hudek

(10) Patent No.: US 10,756,683 B2
(45) Date of Patent: Aug. 25, 2020

(54) TUNABLE, MECHANICALLY STABLE RADIO-FREQUENCY AMPLIFIER

(71) Applicant: IonQ, Inc., College Park, MD (US)

(72) Inventor: Kai Hudek, Hyattsville, MD (US)

(73) Assignee: IONQ, INC., College Park, MD (US)

( * ) Notice: Subject to any disclaimer, the term of this patent is extended or adjusted under 35 U.S.C. 154(b) by 46 days.

(21) Appl. No.: 16/242,264

(22) Filed: Jan. 8, 2019

(65) Prior Publication Data

US 2019/0214949 A1 Jul. 11, 2019

Related U.S. Application Data

(60) Provisional application No. 62/615,234, filed on Jan. 9, 2018.

(51) Int. Cl.
| | |
|---|---|
| *H03F 1/52* | (2006.01) |
| *H03F 3/189* | (2006.01) |
| *H03F 3/191* | (2006.01) |
| *G06N 10/00* | (2019.01) |
| *H01J 49/02* | (2006.01) |

(52) U.S. Cl.
CPC ............. *H03F 1/52* (2013.01); *H03F 3/189* (2013.01); *G06N 10/00* (2019.01); *H01J 49/022* (2013.01); *H03F 2200/451* (2013.01); *H03F 2200/468* (2013.01)

(58) Field of Classification Search
USPC .......................................... 330/75, 305–307
See application file for complete search history.

(56) References Cited

U.S. PATENT DOCUMENTS 9,991,105 B2 * 6/2018 Monroe .............. H01J 49/0027
10,496,932 B2 * 12/2019 Kim .......................... H03H 7/38

* cited by examiner

*Primary Examiner* — Hieu P Nguyen
(74) *Attorney, Agent, or Firm* — Arent Fox LLP

(57) ABSTRACT

The disclosure describes various aspects of a tunable, mechanically stable radio-frequency (RF) amplifier. More specifically, the disclosure describes an RF amplifier designed to be tunable and mechanically stable to match and maintain stable driving of an ion trap for quantum processing applications. A precision actuator is used to finely tune the RF amplifier input in a repeatable and mechanically stable way to match the ion trap resonance. Low-loss tangent materials and torch annealing techniques are used to make the amplifier section mechanically stable.

28 Claims, 9 Drawing Sheets

TUNABLE, MECHANICALLY STABLE RADIO-FREQUENCY AMPLIFIER

CROSS REFERENCE TO RELATED APPLICATION

The present application claims priority to and the benefit of U.S. Provisional Patent Application No. 62/615,234, entitled "TUNABLE, MECHANICALLY STABLE RADIO-FREQUENCY AMPLIFIER," and filed on Jan. 9, 2018, the contents of which are incorporated herein by reference in their entirety.

BACKGROUND OF THE DISCLOSURE

Aspects of the present disclosure generally relate to quantum computing or quantum information processing (QIP) systems, and more specifically, to a tunable, mechanically stable radio-frequency (RF) amplifier.

Individual optically-active quantum systems, such as trapped atoms are one of the leading implementations for quantum information processing. Other implementations may include superconducting circuits. Atomic-based qubits can be used as quantum memories, can host quantum gates in quantum computers and simulators, and can act as nodes for quantum communication networks. Qubits based on trapped atomic ions enjoy a rare combination of attributes. For example, qubits based on trapped atomic ions have very good coherence properties, can be prepared and measured with nearly 100% efficiency, and are readily entangled with each other by modulating their Coulomb interaction or remote photonic interconnects. Lattice of cold (e.g., laser-cooled) trapped atoms have also proven useful for precision metrology, including sensors of small forces and atomic clocks.

Accurate and stable tuning of RF amplifiers are needed to drive ion traps. Therefore, techniques that allow for precision or fine tuning and mechanical stability of RF amplifiers are desirable.

SUMMARY OF THE DISCLOSURE

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its purpose is to present some concepts of one or more aspects in a simplified form as a prelude to the more detailed description that is presented later.

In an aspect of the disclosure, various techniques are described for a tunable, mechanically stable radio-frequency (RF) amplifier. An RF amplifier is described that is tunable and mechanically stable to match and maintain stable driving of an ion trap. A precision actuator is used to finely tune the RF amplifier input in a repeatable and mechanically stable way to match the ion trap resonance. Low-loss-tangent materials and/or torch annealing techniques may be used to make the amplifier section mechanically stable.

For example, an RF amplifier for driving an ion trap in a QIP system includes a housing, a connector configured to receive an RF signal, a first coil coupled to the connector, a second coil inductively coupled to the first coil and configured to amplify the RF signal, where the second coil provides the amplified RF signal to an output of the RF amplifier, and a precision drive coupled to the housing and configured to accurately tune a position of the first coil within the housing by enabling translation of the first coil along an axial direction of the housing, wherein the inductive coupling between the first coil and the second coil is based at least in part on the position of the first coil.

In another example, a method of using an RF amplifier for driving an ion trap in a QIP system includes identifying a tuning position value, and tuning the RF amplifier based on the tuning position value, wherein the RF amplifier includes a housing, a connector configured to receive an RF signal, a first coil coupled to the connector, a second coil inductively coupled to the first coil and configured to amplify the RF signal, where the second coil provides the amplified RF signal to an output of the RF amplifier, and a precision drive coupled to the housing and configured to accurately tune a position of the first coil within the housing by enabling translation of the first coil along an axial direction of the housing, wherein the inductive coupling between the first coil and the second coil is based at least in part on the position of the first coil.

Each of the aspects described above can also be implemented using means for performing the various functions described in connection with those aspects.

BRIEF DESCRIPTION OF THE DRAWINGS

The appended drawings illustrate only some implementation and are therefore not to be considered limiting of scope.

DETAILED DESCRIPTION

Figure 1A:
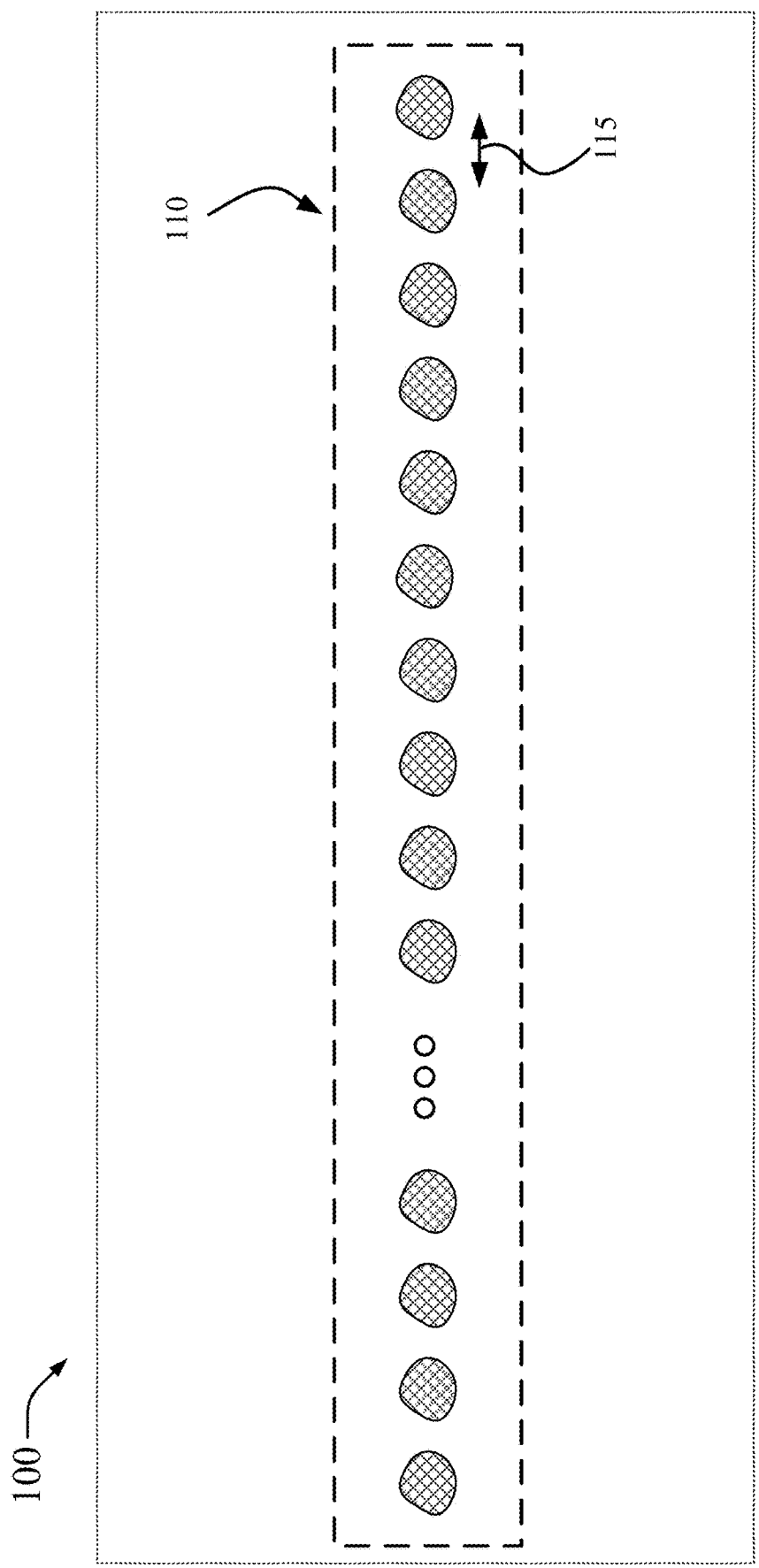
FIG. 1A illustrates a view of a vacuum chamber that houses electrodes for the trapping of atomic ions a linear lattice in accordance with aspects of the disclosure.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known components are shown in block diagram form in order to avoid obscuring such concepts.

As described above, trapped atoms may be used to implement quantum information processing. Atomic-based qubits can be used as different type of devices, including but not limited to quantum memories, the host of quantum gates in quantum computers and simulators, and nodes for quantum communication networks. Qubits based on trapped atomic ions (e.g., atoms with a net state of electrical charge) can have very good coherence properties, can be prepared and measured with nearly 100% efficiency, and can be readily entangled with each other by modulating their Coulomb interaction or remote photonic interconnects. Lattices of cold (e.g., laser-cooled) trapped atoms have also proven useful for precision metrology, including sensors of small forces and atomic clocks. As used in this disclosure, the terms "atoms," "atomic ions," and "ions" may be used interchangeably to describe the particles that are isolated and controlled, or are actually confined, in a trap to form a lattice or similar arrangement or configuration. Where the charge state of the atom (neutral atom or any charge state of the atomic ion) is not relevant, the disclosure described techniques that can be used for any type of neutral atom or atomic ion or other type of optically active quantum system. This disclosure describes techniques for accurate and stable RF amplification of voltages, electric fields, or electrical potentials in RF signals to drive ion traps used in quantum systems.

In the case of atomic ions, the typical ion trap geometry or structure used for quantum information and metrology purposes is the linear radio-frequency (RF) Paul trap (also referred to as an RF trap or simply a Paul trap), where nearby electrodes hold static and dynamic electrical potentials that lead to an effective inhomogeneous harmonic confinement of the ions. The RF Paul trap is a type of trap that uses electric fields to trap or confine charged particles in a particular region, position, or location. When atomic ions are laser-cooled to very low temperatures in such a trap, the atomic ions form a stationary lattice of qubits (e.g., a structured arrangement of qubits), with Coulomb repulsion balancing the external confinement force. For sufficient trap anisotropy, the ions can form a linear lattice along the weak direction of confinement, and this is the arrangement typically employed for applications in quantum information and metrology. As the trap anisotropy is reduced, the atomic ions undergo a series of phase transitions in their static conformation in space, evolving to a two-dimensional (2D) zig-zag or jagged type structure, then a three-dimensional (3D) helical structure, ultimately toward a spherical lattice when the three directions of confinement approach isotropy.

Atomic ions confined using an Paul trap, for example, may require stable, high voltage and low noise radio-frequency (RF) potential. A helical coil may be used as a resonator to produce the desired frequencies that improve the quality factor (Q-factor) of the amplifier. Aspects of this disclosure describe techniques for implementing an RF amplifier that provides flexibility in tuning as well as mechanical stability in order to avoid the types of drifts and instabilities that may be caused by existing RF amplifiers.

FIG. 1A illustrates a partial view of a vacuum chamber 100 that houses electrodes for the trapping of atomic ions in a linear lattice or crystal 110 using a linear RF Paul trap. In the example shown in FIG. 1A, a vacuum chamber in a quantum system includes electrodes for trapping 20 atomic Ytterbium ions (e.g., $^{171}Yb^+$ ions) which are confined in the linear lattice 110 and are laser-cooled to be nearly at rest. While 20 atomic ions are shown in this example, the number of atomic ions trapped can be configurable and more or fewer than 20 atomic ions may be trapped. The atoms are illuminated with laser radiation tuned to a resonance in $^{171}Yb^+$ and the fluorescence of the atomic ions is imaged onto a camera. In this example, atomic ions are separated by a distance 115 of about 5 microns (μm) from each other as shown by fluorescence. The separation of the atomic ions is determined by a balance between the external confinement force and Coulomb repulsion.

Atomic ions are typically loaded into traps by creating a neutral atomic flux of the desired particle, and ionizing them once in the trapping volume. Ions can remain confined for months, with lifetimes often limited by the level of vacuum. Elastic collisions with residual background gas occur roughly once per hour per ion at typical ultra-high vacuum (UHV) pressures (~$10^{-11}$ torr) and do not necessarily eject the ion from its position in the trap, although inelastic collisions can change the species or isotope of the trapped ion. Cryogenic chambers can virtually eliminate these collision events by further reducing the background pressure (e.g., limiting the outgassing of materials).

Figure 1B:
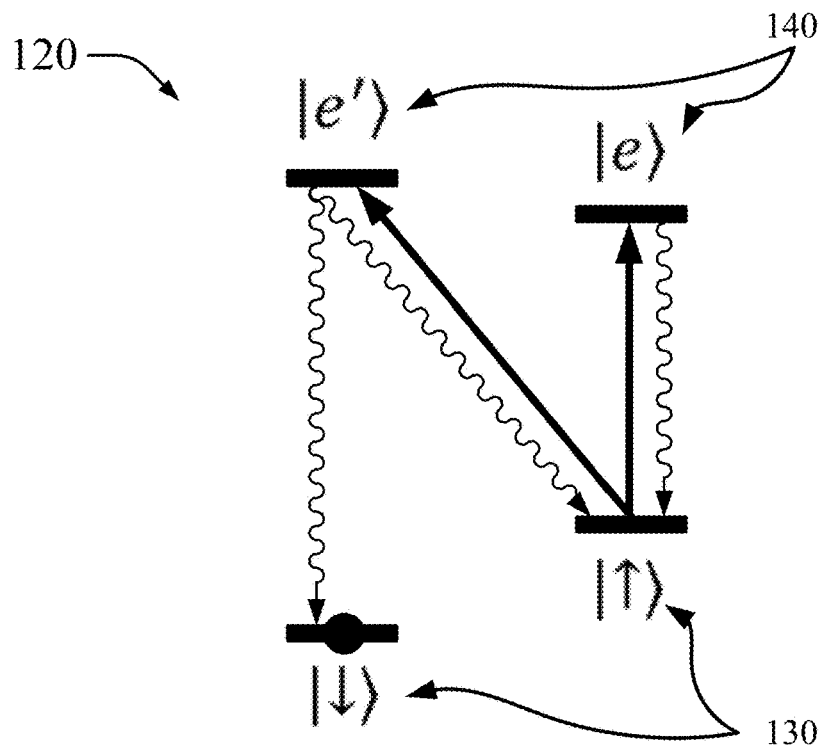
FIG. 1B is a diagram illustrating an example of a reduced energy level diagram showing the application of laser radiation for state initialization in accordance with aspects of the disclosure.
Figure 1C:
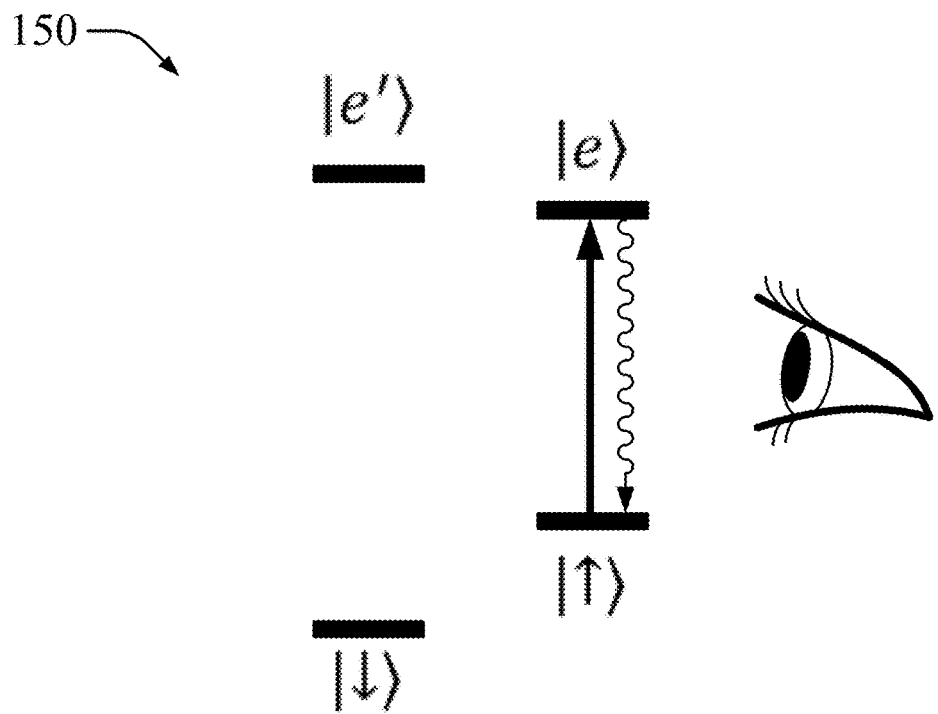
FIG. 1C is a diagram illustrating an example of a reduced energy level diagram showing the application of laser radiation for qubit state detection through fluorescence in accordance with aspects of the disclosure.

Strong fluorescence of individual trapped atomic ions relies on the efficient cycling of photons, thus the atomic structure of the ion must have a strong closed optical transition that allows for laser-cooling of the motion, qubit state initialization, and efficient qubit readout. This may rule out many atomic ion species, apart from simple atomic ions with a lone outer electron, such as the alkaline-earths ($Be^+$, $Mg^+$, $Ca^+$, $Sr^+$, $Ba^+$) and particular transition metals ($Zn^+$, $Hg^+$, $Cd^+$, and $Yb^+$). Within these atomic ions, quantum bits can be represented by two stable electronic levels, often characterized by an effective spin with the two states $|\uparrow>$ and $|\downarrow>$ or equivalently $|1>$ and $|0>$. FIG. 1B and FIG. 1C show the reduced energy level diagrams 120 and 150, respectively, for atomic ion $^{171}Yb^+$, where the qubit levels $|\uparrow>$ and $|\downarrow>$ 130 are represented by the stable hyperfine levels in the ground electronic state, and are separated by frequency $\omega_0/2\pi=12.642$ GHz. The excited electronic states $|e>$ and $|e'>$ 140 in $^{171}Yb^+$ are themselves split by a smaller hyperfine coupling and are separated from the ground states by an optical interval having an energy corresponding to an optical wavelength of 369.53 nm.

Laser radiation tuned just below resonance in these optical transitions allows for Doppler laser cooling to confine the atomic ions near the bottom of the trap. Other more sophisticated forms of laser cooling can bring the atomic ions to be nearly at rest in the trap.

When a bichromatic laser beam (e.g., a beam with two tones produced by sidebands resulting from optical modulation) resonant with both $|\uparrow><\leftrightarrow|e>$ and $|\uparrow><\leftrightarrow|e'>$ transitions is applied to the atom, it rapidly falls into the state $|\downarrow>$ and no longer interacts with the light field, allowing the initialization of the qubit with essentially 100% fidelity (see e.g., FIG. 1B).

When a single laser beam resonant with the $|\uparrow><\leftrightarrow|e>$ transition is applied, a closed cycling optical transition causes an ion in the $|\uparrow>$ state to fluoresce strongly while an ion in the $|\downarrow>$ state stays dark because the laser frequency is far from its resonance (see e.g., FIG. 1C). The collection of even a small fraction of this fluorescence allows for the detection of the atomic qubit state with near-perfect efficiency or accuracy. Other atomic species may have similar initialization/detection schemes.

In FIGS. 1B and 1C, all allowed transitions from the excited electronic states |e> and |e'> 140 are illustrated as downward, wavy arrows. On the other hand, the applied laser radiation (which is shown as upward, straight arrows) drive these transitions for initialization to state |↓> as shown in FIG. 1B, and for fluorescence detection of the qubit state (|↑>=fluorescence, |↓>=no fluorescence) as shown in FIG. 1C.

As described above, accurate and stable tuning of radio-frequency (RF) amplifiers are needed to drive ion traps and control the lattice. These RF amplifiers typically provide resonant gain, where temperature and/or mechanical instability of the RF amplifier can cause the resonant peak to shift around. Therefore, when a fixed RF frequency is being used to drive the ion trap and the gain changes because of shifts in the resonant peak, the output of the RF amplifier may fluctuate causing problems to properly drive the ion trap. Accordingly, techniques, such as those described above, the provide mechanical and/or temperature stability, are desirable in the implementation of RF amplifiers.

Figure 2:
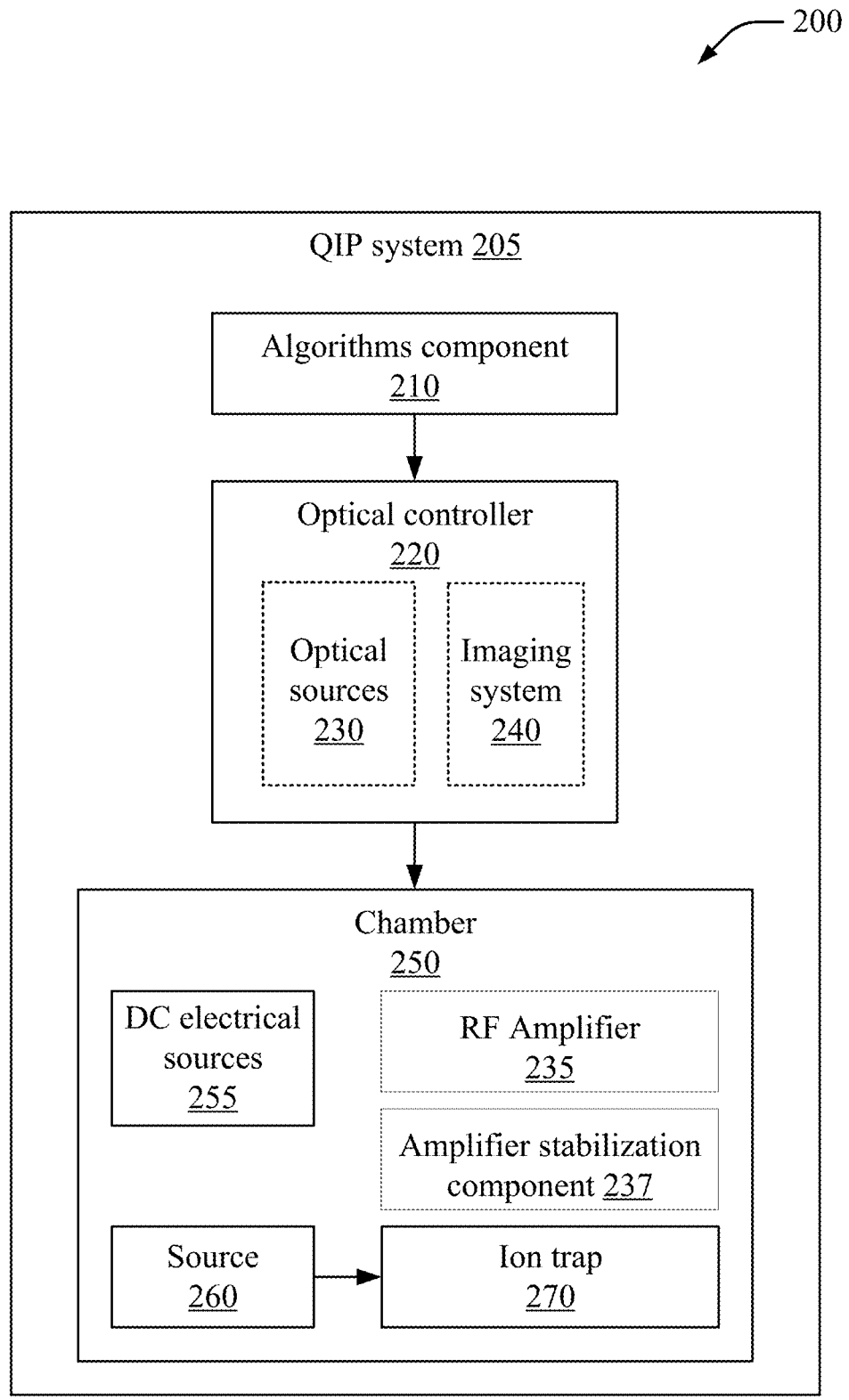
FIG. 2 is a block diagram that illustrates an example of a quantum information processing (QIP) system in accordance with aspects of this disclosure.

FIG. 2 is a block diagram 200 that illustrates an example of a QIP system 205 in accordance with aspects of this disclosure. The QIP system 205 may also be referred to as a quantum computing system, a computer device, or the like. In an aspect, the QIP system 205 may correspond to portions of a quantum computer implementation of the computing device 500 in FIG. 5.

The QIP system 205 can include a source 260 that provides atomic species (e.g., a flux of neutral atoms) to a chamber 250 (see e.g., vacuum chamber 100 in FIG. 1A) having an ion trap 270 (also referred to as a surface trap) that traps the atomic species once ionized (e.g., photoionized) by an optical controller 220. The source 260 can be part of the chamber 250 as illustrated in FIG. 2. Optical sources 230 in the optical controller 220 may include one or more laser sources that can be used for ionization of the atomic species, control (e.g., phase control) of the atomic ions, for fluorescence of the atomic ions that can be monitored and tracked by image processing algorithms operating in an imaging system 240 in the optical controller 220, and for the overall control of optical operations associated with the atomic ions in the ion trap 270. The imaging system 240 can include a high resolution imager (e.g., CCD camera) for monitoring the atomic ions while they are being provided to the ion trap 270 (e.g., for counting) or after they have been provided to the ion trap 270 (e.g., for monitoring the atomic ions states). In an aspect, the imaging system 240 can be implemented separate from the optical controller 220, however, the use of fluorescence to detect, identify, and label atomic ions using image processing algorithms may need to be coordinated with the optical controller 220.

The chamber 250 may include one or more RF amplifiers 235 to drive RF potentials to the ion trap 270 in accordance with aspects of this disclosure and described in more detail in FIGS. 3A-3D below. In some implementations, the RF amplifiers 235 may be separate from or outside the chamber 250. Also shown in the chamber 250 are DC electrical sources 255, which may be used in connection with the ion trap 270 as well. Like the RF amplifiers 235, the DC electrical sources 255 can also be implemented separate from or outside the chamber 250.

The chamber 250 may also include an amplifier stabilization component 237 configured to control an input to the RF amplifiers 235 and/or a temperature of the RF amplifiers 235 to provide a stable output (e.g., a stable output power). The amplifier stabilization component 237 can also be implemented separate from or outside the chamber 250.

The QIP system 205 may also include an algorithms component 210 that may operate with other parts of the QIP system 205 (not shown) to perform quantum algorithms or quantum operations. As such, the algorithms component 210 may provide instructions to various components of the QIP system 205 (e.g., to the optical controller 220) to enable the implementation of the quantum algorithms or quantum operations.

FIGS. 3A, 3B, 3C, and 3D show diagrams 300, 303, 305, and 307 respectively, that illustrate various views of the RF amplifier 235. The RF amplifier 235 may also be referred to as an RF resonator or simply as a resonator as they are generally based on a helical coil resonator to produce voltage amplification. In the diagram 300, a perspective view is shown inside the RF amplifier 235. The RF amplifier 235 consists of a highly conductive housing 380 that acts as the RF ground and mechanically stable mounting structure. A low power RF (e.g., low power RF signal) is injected via a connector 340. The connector 340 can be a SubMiniature version A (SMA) connector or similar. In some instances, the connector 340 can be a BNC connector, an N-Type connector, or some other commercially available high quality, low loss RF connector. The RF input drives an input coil 330 that is wound around, and secured to, a low-loss-tangent material, such as polytetrafluoroethylene (PTFE). The position of the input coil 330 is accurately tuned axially, that is, along the drive axis, via a precision drive 310, such as a fine-thread screw or micrometer. The precision drive 310 is configured to translate rotation into linear motion of the input coil 330. The precision drive 310 may also be implemented with a sliding mechanism as long as the mechanism is controlled to provide the desired adjustable tuning. The input coil 330 may be secured from rotating, and is further mechanically stabilized, by pins 320, while still allowing for smooth axial translation.

Amplification of the input RF is performed by a main coil 350. In this disclosure, the input coil 330 may be referred to as a first coil and the main coil 350 may be referred to as a second coil. Construction of the main coil 350 may be performed via torch annealing of a high-conductivity copper rod in such a way that it stays annealed only during the construction process. Mechanical stability of the main coil 350 may be assured by the work hardening that occurs during construction. Axial centering of the main coil 350, and further mechanical stability, are provided by low-loss-tangent material holders 360 having various teeth, where the precision of the teeth spacing and depth maintain the main coil's position and pitch. In some implementations, the holders 360 can be cylindrical to encompass all around the main coil 350, where the teeth of the holders 360 are precision-machined in the inside of the cylinder to maintain the form factor of the main coil 350.

Figure 3A:
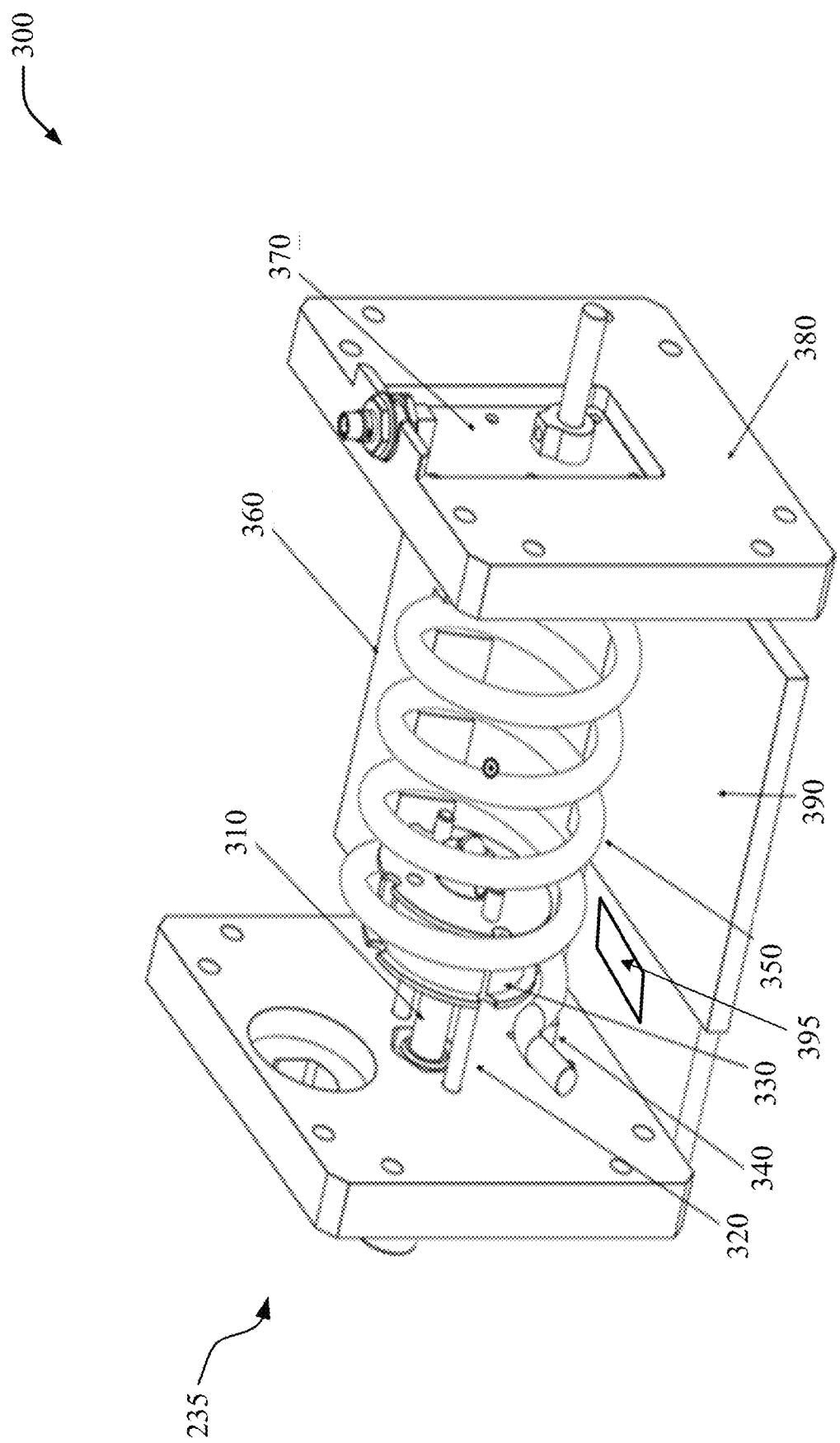
FIG. 3A is a diagram that illustrates a perspective view inside a RF amplifier in accordance with aspect of this disclosure.

Also shown in FIG. 3A is an active stabilizer 370 that may be integrated into the RF amplifier's output stage.

FIG. 3A also shows a thermal device 390 disposed on the housing 380 and configured to control a temperature of the RF amplifier 235 by adjusting a temperature of the housing 380. The thermal device 390 may be a heater or a cooler such as thermoelectric cooler (TEC), for example. Also shown is a sensor (e.g., a temperature sensor) 395 configured to monitor a temperature of the housing 380 and used in connection with the thermal device 390 to provide feedback for controlling the temperature of the housing through the thermal 390. Although a single sensor 395 is shown, multiple sensors 395 may be used and positioned in different places of the housing 380 to monitor a thermal profile of the housing 380. Moreover, one or more thermal devices 390 may be positioned at different places to better control the thermal profile of the housing 380. In some implementations, when multiple thermal devices 390 are used to control the temperature, the multiple thermal devices 390 can all be heaters, can all be coolers, or can be a combination of heaters and coolers that are collectively or individually controlled to provide the proper thermal profile.

The RF amplifier 235 may be used in various types of QIP systems (e.g., QIP system 205 in FIG. 2) or other types of quantum computing systems that make use of ion traps. Some of the advantages provided by the features of the RF amplifier 235 are the ability to finely and repeatedly tune the RF amplifier, while providing mechanical stability that is built into the construction of the RF amplifier.

Figure 3B:
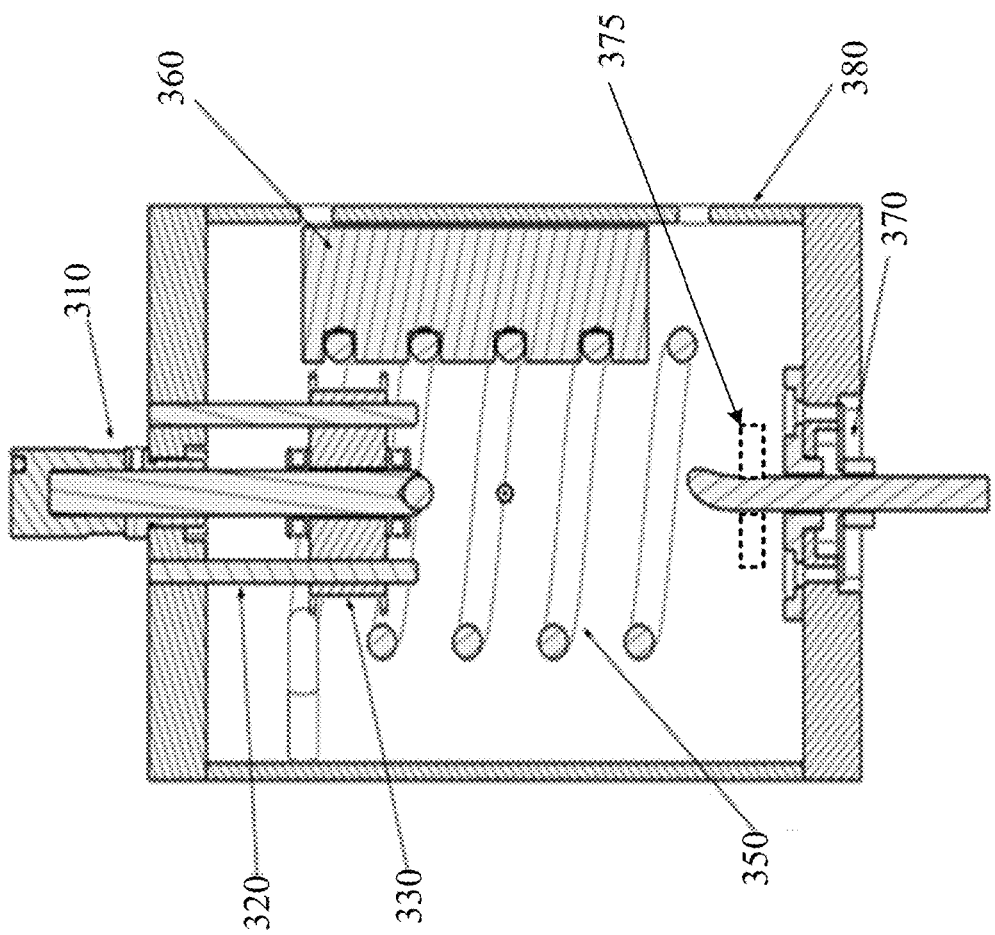
FIG. 3B is a diagram that illustrates a top, cross-sectional view of an RF amplifier in accordance with aspects of this disclosure.

The diagram 303 in FIG. 3B shows a top, cross-section view of the RF amplifier 235 indicating the position of the precision drive 310, the pins 320, the input coil 1 330, the main coil 350, the holders 360, the stabilizer 370, and the housing 380. Also shown is an example of the position of a voltage monitoring circuit 375 coupled to an output portion of the main coil 350. Additional details regarding the voltage monitoring circuit 375 are provided below in connection with FIG. 3D.

Figure 3C:
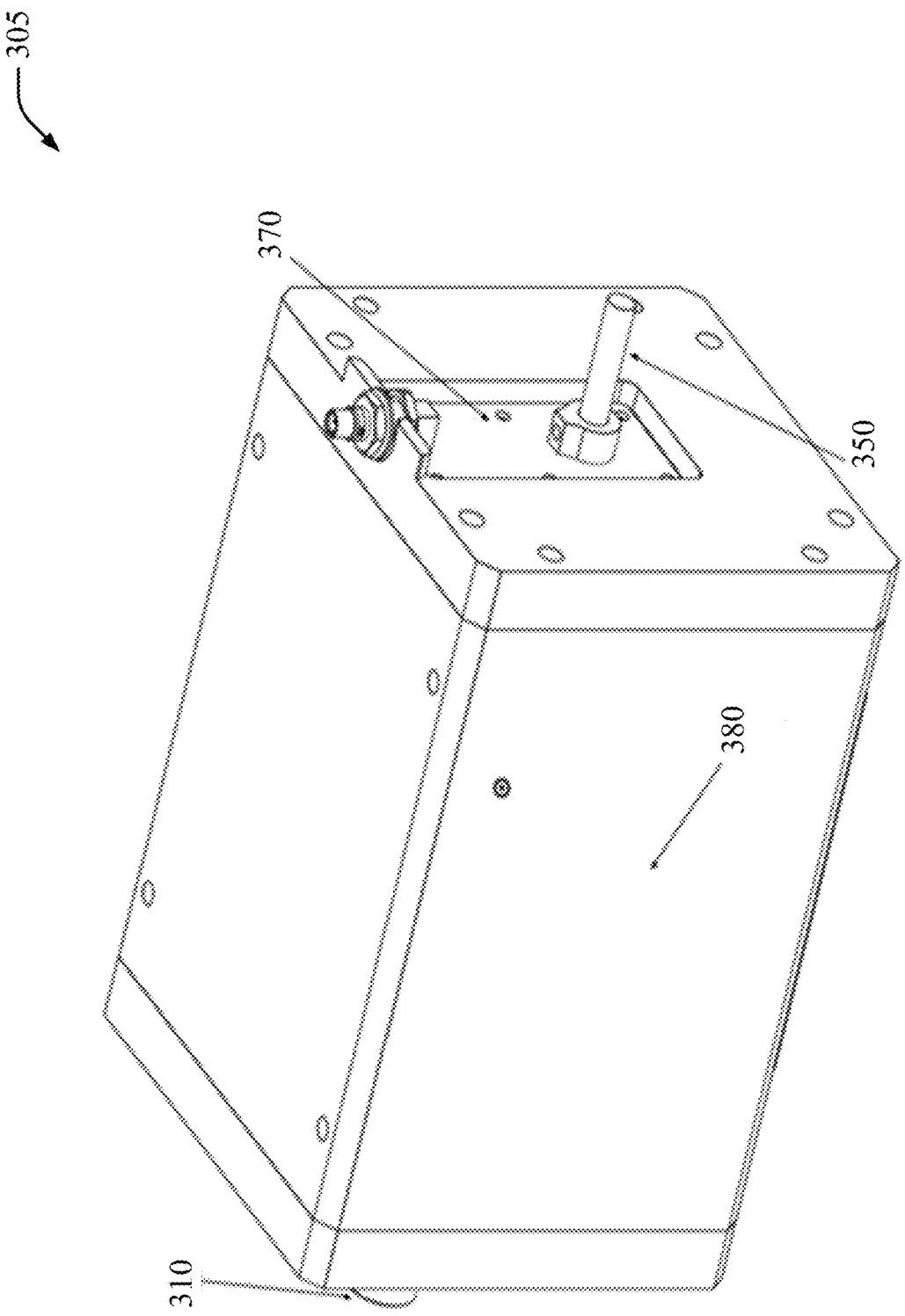
FIG. 3C is a diagram that illustrates a perspective view outside an RF amplifier in accordance with aspects of this disclosure.

The diagram 305 in FIG. 3C shows a perspective view of the outside of the RF amplifier 235 indicating the position of the precision drive 310, the main coil 350, the stabilizer 370, and the housing 380.

Figure 3D:
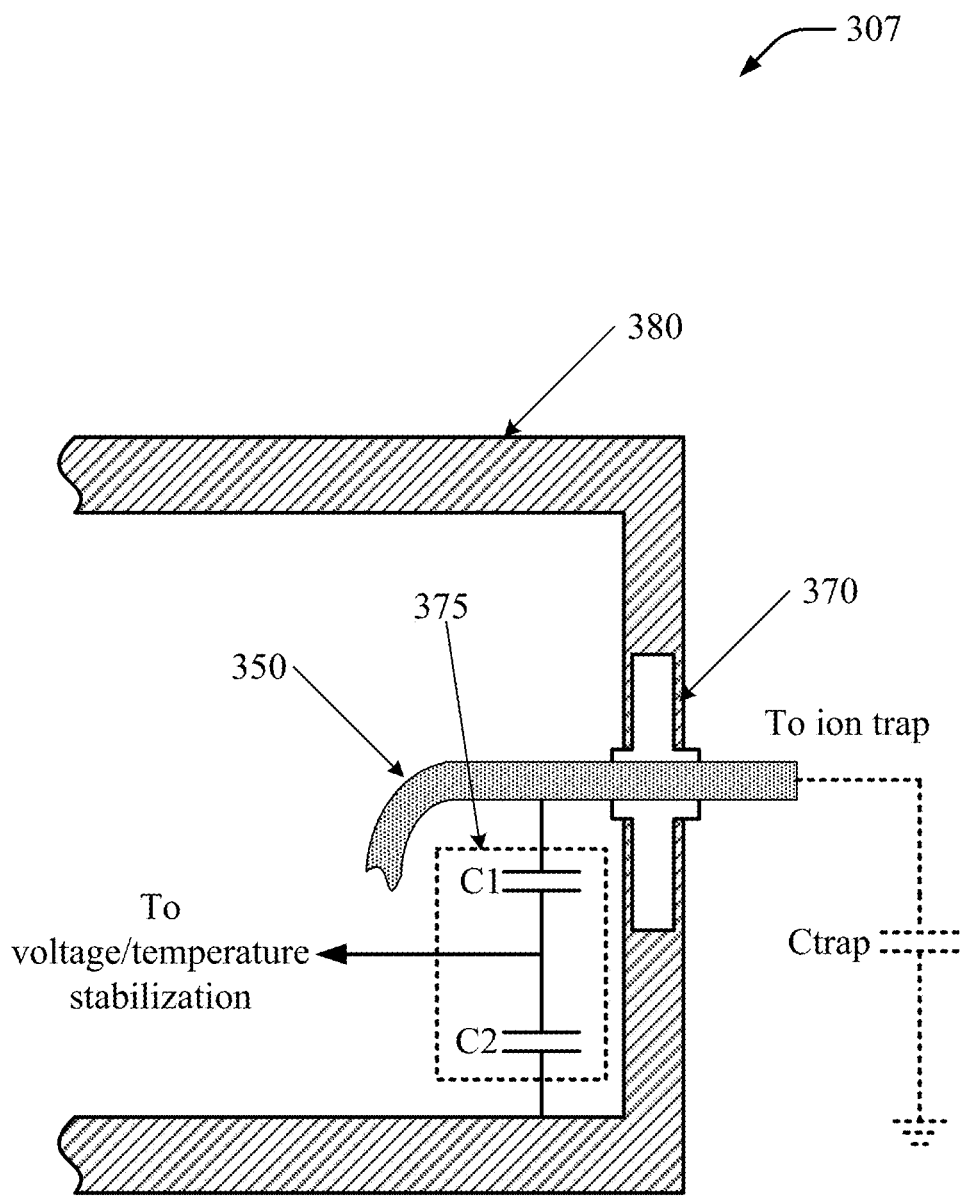
FIG. 3D is a diagram that illustrates a voltage monitoring circuit at an output of an RF amplifier in accordance with aspects of this disclosure.

The diagram 307 in FIG. 3D shows a side, cross-section view of an output portion of the RF amplifier 235 illustrating a portion of the housing 380 and the main coil 350 that is coupled to and drives the ion trap via the stabilizer 370. The RF amplifier 235 drives a capacitance Ctrap of a vacuum feedthrough and ion trap electrodes. The diagram 307 also shows the voltage monitoring circuit 375, which monitors a voltage or power of the amplified RF signal and provides feedback to, for example, the amplifier stabilization component 237 in FIG. 2. In other implementations, the voltage monitoring circuit 375 can be placed outside or external to the housing 380 and closer the ion trap. The amplifier stabilization component 237 can process this feedback to control or adjust an RF input to the RF amplifier 235 and/or a temperature of the RF amplifier 235 (e.g., see above temperature control using the temperature sensor 395 and the thermal device 390) to stabilize (e.g., avoid fluctuations) the output of the RF amplifier 235.

In one implementation, the voltage monitoring circuit 375 may include a pick-off voltage divider constructed from two capacitances, C1 and C2, where a voltage between the two capacitances may be used for monitoring the output of the RF amplifier 235. In an example, C1=0.2 pF and C2=20 pF. Moreover, C1 and C2 are not only disposed within the housing 380 but may also be integrated with the housing 380. Implementations of the voltage monitoring circuit 375 need not be limited to the example shown in the diagram 307 and other techniques, structures, circuits, or devices may also be used.

In an aspect, the RF amplifier 235 in FIGS. 3A-3D may generally include a housing (e.g., housing 380), a connector configured to receive an RF signal (e.g., connector 340), a first coil coupled to the connector (e.g., input coil 330), a second coil (e.g., main coil 350) inductively coupled to the first coil and configured to amplify the RF signal, where the second coil provides the amplified RF signal to an output of the RF amplifier, and a precision drive (e.g., precision drive or actuator 310) coupled to the housing and configured to accurately tune a position of the first coil within the housing by enabling translation of the first coil along an axial direction of the housing, wherein the inductive coupling between the first coil and the second coil is based at least in part on the position of the first coil.

Previous RF amplifiers used in QIP systems rely on manual alignment and are not generally stable. By using the precision drive 310, it is possible to perform a controlled in-situ optimization of the RF amplifier to account for the various capacitances of the system.

Once the input coil 330 and the main coil 350 are positioned relative to each other, a network analyzer measurement may be performed to measure delivered power and/or reflected power by sweeping a test signal (e.g., a sinusoid RF signal) across the resonant frequencies in order to obtain a quality factor (Q-factor) of the RF amplifier 235. The RF amplifier 235 may operate like a notch filter or passband filter. In another aspect, the network analyzer measurement may also be performed by means of the stabilizer 370.

Figure 4:
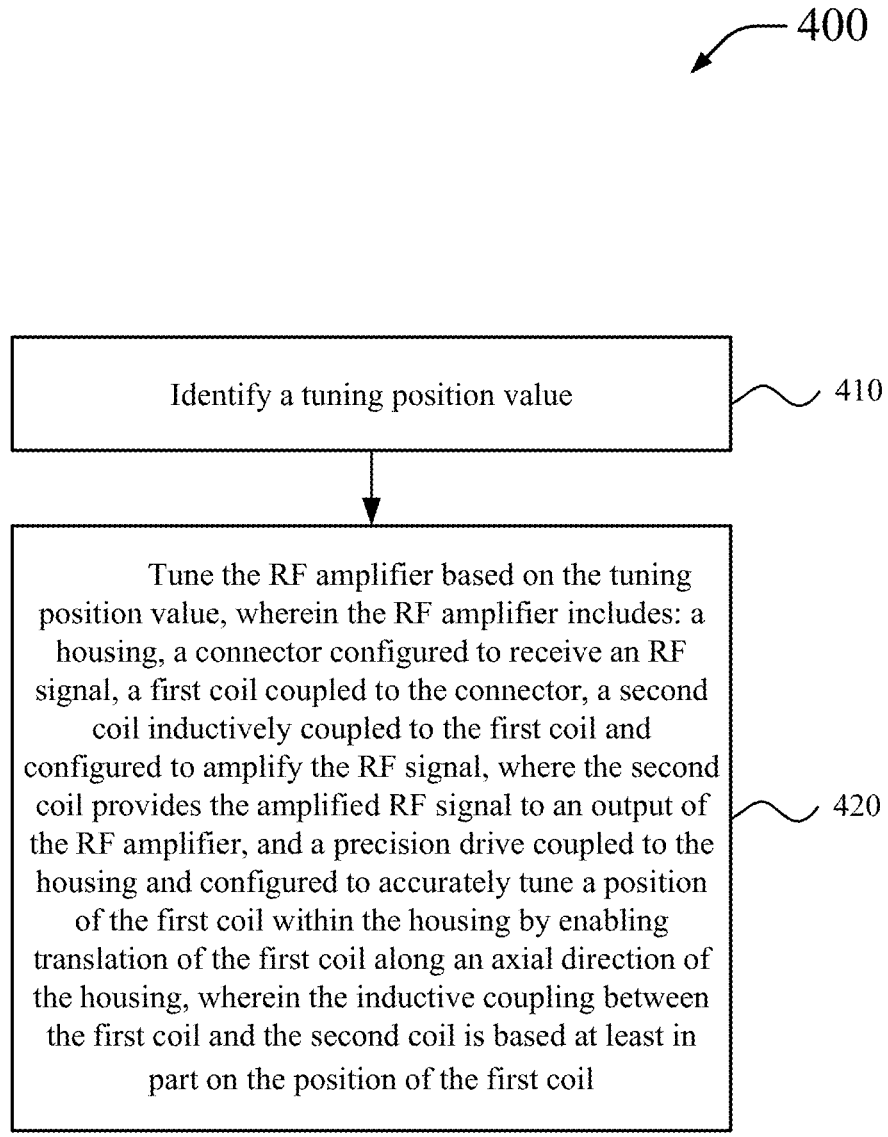
FIG. 4 is a flow diagram that illustrates an example of a method in accordance with aspects of this disclosure.

FIG. 4 is a flow diagram that illustrates an example of a method 400 for using an RF amplifier for driving optical sources in a QIP system in accordance with aspects of this disclosure. In an aspect, the method 400 may be performed in a computer system such as the computer system 500 described below. Similarly, the functions of the method 400 may be performed by one or more components of a QIP system such as the QIP system 205 and its components, where the QIP system includes an ion trap.

At 410, the method 400 includes identifying a tuning position value.

At 420, the method 400 includes tuning the RF amplifier based on the tuning position value, where the RF amplifier includes a housing, a connector configured to receive an RF signal, a first coil coupled to the connector, a second coil inductively coupled to the first coil and configured to amplify the RF signal, where the second coil provides the amplified RF signal to an output of the RF amplifier, and a precision drive coupled to the housing and configured to accurately tune a position of the first coil within the housing by enabling translation of the first coil along an axial direction of the housing, wherein the inductive coupling between the first coil and the second coil is based at least in part on the position of the first coil.

In an aspect of the method 400, the precision drive is a fine-thread screw or a micrometer, and tuning the RF amplifier based on the tuning position value includes adjusting the fine-thread screw or the micrometer based on the tuning value to tune the position of the first coil within the housing.

In another aspect of the method 400, the RF amplifier includes an electronic controller and the method 400 further includes receiving signals at the electronic controller and having the electronic controller control the precision drive based on the received signals to tune the position of the first coil.

In another aspect of the method 400, tuning the RF amplifier includes adjusting the precision drive by turning the precision drive to a position that corresponds to the tuning position value.

In another aspect of the method 400, the method 400 includes monitoring an output power of the amplified RF signal. The RF signal may be adjusted based at least in part on the monitoring of the output power of the amplified RF signal. Moreover, the method 400 may include monitoring a temperature of the housing and adjusting the temperature based at least in part on the monitoring of the output power of the amplified RF signal.

Figure 5:
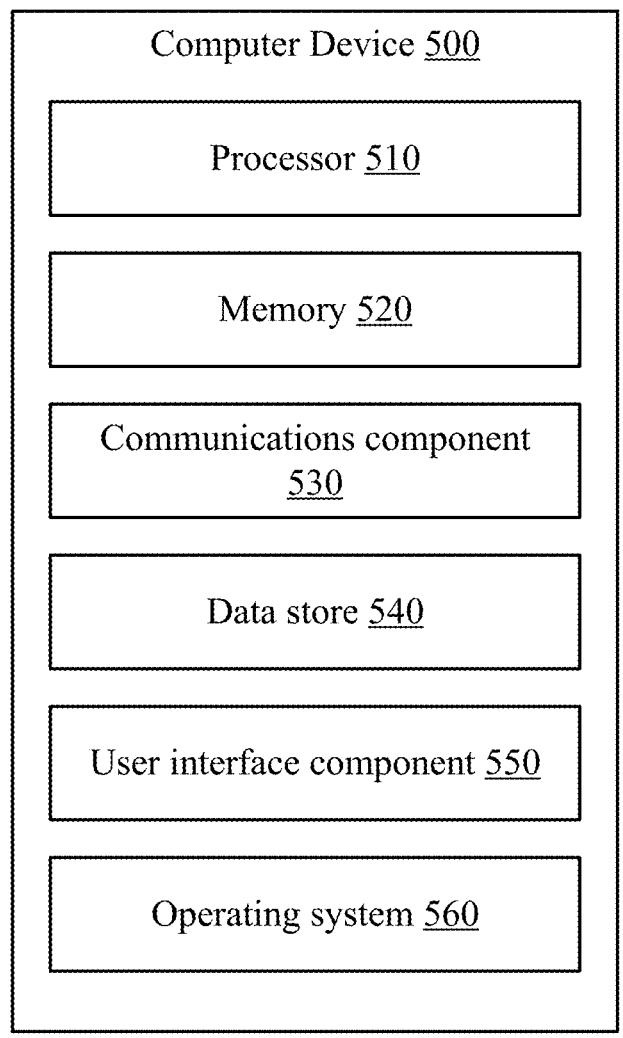
FIG. 5 is a diagram that illustrates an example of a computer device in accordance with aspects of this disclosure.

Referring now to FIG. 5, illustrated is an example computer device 500 in accordance with aspects of the disclosure. The computer device 500 can represent a single computing device, multiple computing devices, or a distributed computing system, for example. The computer device 500 may be configured as a quantum computer, a classical computer, or a combination of quantum and classical computing functions. For example, the computer device 500 may be used to process information using quantum algorithms based on trapped ion technology and may therefore implement finely tuned and mechanically stable RF amplification for use with ion traps as described above. As described above, the QIP system 205 may be an example of at least a portion of the computer device 500.

In one example, the computer device 500 may include a processor 510 for carrying out processing functions associated with one or more of the features described herein. The processor 510 may include a single or multiple set of processors or multi-core processors. Moreover, the processor 510 may be implemented as an integrated processing system and/or a distributed processing system. The processor 510 may include a central processing unit (CPU), a quantum processing unit (QPU), a graphics processing unit (GPU), or combination of those types of processors. In one aspect, the processor 510 may refer to a general processor of the computer device 510, which may also include additional processors 510 to perform more specific functions such as control of RF amplification tuning to drive ion traps, for example.

In an example, the computer device 500 may include a memory 520 for storing instructions executable by the processor 510 for carrying out the functions described herein. In an implementation, for example, the memory 520 may correspond to a computer-readable storage medium that stores code or instructions to perform one or more of the functions or operations described herein. In one example, the memory 520 may include instructions to perform aspects of a method 400 described below in connection with FIG. 4. Just like the processor 510, the memory 520 may refer to a general memory of the computer device 500, which may also include additional memories 520 to store instructions and/or data for more specific functions such as instructions and/or data for RF amplification tuning to drive ion traps, for example.

Further, the computer device 500 may include a communications component 530 that provides for establishing and maintaining communications with one or more parties utilizing hardware, software, and services as described herein. The communications component 530 may carry communications between components on the computer device 500, as well as between the computer device 500 and external devices, such as devices located across a communications network and/or devices serially or locally connected to computer device 500. For example, the communications component 500 may include one or more buses, and may further include transmit chain components and receive chain components associated with a transmitter and receiver, respectively, operable for interfacing with external devices.

Additionally, the computer device 500 may include a data store 540, which can be any suitable combination of hardware and/or software, that provides for mass storage of information, databases, and programs employed in connection with implementations described herein. For example, the data store 540 may be a data repository for operating system 560 (e.g., classical OS, or quantum OS). In one implementation, the data store 540 may include the memory 520.

The computer device 500 may also include a user interface component 550 operable to receive inputs from a user of the computer device 500 and further operable to generate outputs for presentation to the user or to provide to a different system (directly or indirectly). The user interface component 550 may include one or more input devices, including but not limited to a keyboard, a number pad, a mouse, a touch-sensitive display, a digitizer, a navigation key, a function key, a microphone, a voice recognition component, any other mechanism capable of receiving an input from a user, or any combination thereof. Further, the user interface component 550 may include one or more output devices, including but not limited to a display, a speaker, a haptic feedback mechanism, a printer, any other mechanism capable of presenting an output to a user, or any combination thereof.

In an implementation, the user interface component 550 may transmit and/or receive messages corresponding to the operation of the operating system 560. In addition, the processor 510 may execute the operating system 560 and/or applications or programs, and the memory 520 or the data store 540 may store them.

When the computer device 500 is implemented as part of a cloud-based infrastructure solution, the user interface component 550 may be used to allow a user of the cloud-based infrastructure solution to remotely interact with the computer device 500.

Although the present disclosure has been provided in accordance with the implementations shown, one of ordinary skill in the art will readily recognize that there could be variations to the embodiments and those variations would be within the scope of the present disclosure. Accordingly, many modifications may be made by one of ordinary skill in the art without departing from the scope of the appended claims.

What is claimed is:

1. A radio-frequency (RF) amplifier for driving an ion trap in a quantum information processing (QIP) system, comprising:
 a housing;
 a connector configured to receive an RF signal;
 a first coil coupled to the connector;
 a second coil inductively coupled to the first coil and configured to amplify the RF signal, and wherein the second coil provides the amplified RF signal to an output of the RF amplifier; and
 a precision drive coupled to the housing and configured to accurately tune a position of the first coil within the housing by enabling translation of the first coil along an axial direction of the housing, wherein the inductive coupling between the first coil and the second coil is based at least in part on the position of the first coil.

2. The RF amplifier of claim 1, further comprising one or more pins coupled to the housing to provide mechanical stability to the first coil and configured to secure the first coil from rotating.

3. The RF amplifier of claim 1, further comprising one or more holders coupled to the housing and having multiple teeth, wherein the teeth spacing and depth of the teeth are configured to maintain the coil position and pitch.

4. The RF amplifier of claim 3, wherein the one or more holders are made at least in part of a low-loss-tangent material.

5. The RF amplifier of claim 3, wherein the one or more holders are cylindrical with the teeth in the inner part of the cylinder.

6. The RF amplifier of claim 1, wherein the precision drive is a fine-thread screw or a micrometer.

7. The RF amplifier of claim 1, wherein the first coil is wound around a low-loss-tangent material.

8. The RF amplifier of claim 6, wherein the low-loss-tangent material contains polytetrafluoroethylene (PTFE).

9. The RF amplifier of claim 1, wherein the housing is a conductive housing configured to provide RF ground.

10. The RF amplifier of claim 1, wherein the housing is a conductive housing configured to provide a mechanically stable mounting structure.

11. The RF amplifier of claim 1, wherein the second coil is constructed via torch annealing of a high-conductivity copper rod such that the second coil stays annealed only during the construction process.

12. The RF amplifier of claim 1, further comprising an electronic controller configured to receive signals and control the precision drive based on the received signals to tune the position of the first coil relative to the second coil.

13. The RF amplifier of claim 1, wherein the second coil is configured to be coupled to the ion trap.

14. The RF amplifier of claim 1, wherein the connector is a SubMiniature version A (SMA) connector.

15. The RF amplifier of claim 1, wherein the connector is one of a BNC connector, an N-Type connector, or other low loss RF connector.

16. The RF amplifier of claim 1, further comprising a heater, a cooler, or a combination of a heater and a cooler, disposed on the housing and configured to control a temperature of the housing.

17. The RF amplifier of claim 1, further comprising a sensor disposed on the housing and configured to measure a temperature of the housing.

18. The RF amplifier of claim 1, further comprising a voltage monitoring circuit disposed within the housing and coupled to the output of the RF amplifier, wherein the voltage monitoring circuit is configured to monitor an output power of the amplified RF signal.

19. The RF amplifier of claim 18, wherein the voltage monitoring circuit is integrated with the housing.

20. The RF amplifier of claim 1, further comprising a voltage monitoring circuit disposed outside or external to the housing and coupled to the output of the RF amplifier, wherein the voltage monitoring circuit is configured to monitor an output power of the amplified RF signal.

21. A method of using a radio-frequency (RF) amplifier for driving an ion trap in a quantum information processing (QIP) system, comprising:
identifying a tuning position value; and
tuning the RF amplifier based on the tuning position value, wherein the RF amplifier includes:
a housing;
a connector configured to receive an RF signal;
a first coil coupled to the connector;
a second coil inductively coupled to the first coil and configured to amplify the RF signal, and wherein the second coil provides the amplified RF signal to an output of the RF amplifier; and
a precision drive coupled to the housing and configured to accurately tune a position of the first coil within the housing by enabling translation of the first coil along an axial direction of the housing, wherein the inductive coupling between the first coil and the second coil is based at least in part on the position of the first coil.

22. The method of claim 21, wherein the precision drive is a fine-thread screw or a micrometer, and tuning the RF amplifier based on the tuning position value includes adjusting the fine-thread screw or the micrometer based on the tuning value to tune the position of the first coil within the housing.

23. The method of claim 21, wherein the RF amplifier includes an electronic controller, the method further comprising receiving signals at the electronic controller and having the electronic controller control the precision drive based on the received signals to tune the position of the first coil.

24. The method of claim 21, wherein tuning the RF amplifier includes adjusting the precision drive by turning the precision drive to a position that corresponds to the tuning position value.

25. The method of claim 21, further comprising monitoring an output power of the amplified RF signal.

26. The method of claim 25, further comprising adjusting the RF signal based at least in part on the monitoring of the output power of the amplified RF signal.

27. The method of claim 25, further comprising:
monitoring a temperature of the housing; and
adjusting the temperature based at least in part on the monitoring of the output power of the amplified RF signal.

28. A system for driving an ion trap in a quantum information processing (QIP) system, comprising:
an amplifier stabilization component; and
a radio-frequency (RF) amplifier including:
a housing;
a connector configured to receive an RF signal;
a first coil coupled to the connector;
a second coil inductively coupled to the first coil and configured to amplify the RF signal, and wherein the second coil provides the amplified RF signal to an output of the RF amplifier;
a precision drive coupled to the housing and configured to accurately tune a position of the first coil within the housing by enabling translation of the first coil along an axial direction of the housing, wherein the inductive coupling between the first coil and the second coil is based at least in part on the position of the first coil;
a temperature sensor;
a heater, a cooler, or a combination of a heater and a cooler; and
a voltage monitoring circuit,
wherein the amplifier stabilization component is configured to receive feedback from one or both of the temperature sensor or the voltage monitoring circuit, and to control one or both of an amplitude of the RF signal or an input to the thermoelectric cooler to stabilize an output power of the amplified RF signal.

* * * * *